United States Patent
Huang et al.

(10) Patent No.: US 11,810,815 B2
(45) Date of Patent: Nov. 7, 2023

(54) DIELECTRIC CAPPING STRUCTURE OVERLYING A CONDUCTIVE STRUCTURE TO INCREASE STABILITY

(71) Applicant: Taiwan Semiconductor Manufacturing Company, Ltd., Hsin-Chu (TW)

(72) Inventors: Hsin-Yen Huang, New Taipei (TW); Chi-Lin Teng, Taichung (TW); Hai-Ching Chen, Hsinchu (TW); Shau-Lin Shue, Hsinchu (TW); Shao-Kuan Lee, Kaohsiung (TW); Cheng-Chin Lee, Taipei (TW); Ting-Ya Lo, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/729,429

(22) Filed: Apr. 26, 2022

(65) Prior Publication Data

US 2022/0254678 A1     Aug. 11, 2022

Related U.S. Application Data

(62) Division of application No. 16/876,432, filed on May 18, 2020, now Pat. No. 11,322,395.

(Continued)

(51) Int. Cl.
*H01L 21/768* (2006.01)
*H01L 23/532* (2006.01)

(Continued)

(52) U.S. Cl.
CPC ...... *H01L 21/7682* (2013.01); *H01L 23/5329* (2013.01); *H01L 21/764* (2013.01);
(Continued)

(58) Field of Classification Search
CPC ............ H01L 21/7682; H01L 23/5329; H01L 23/528; H01L 23/53295; H01L 23/5222;
(Continued)

(56) References Cited

U.S. PATENT DOCUMENTS

2015/0311151 A1   10/2015   Chi et al.
2017/0092578 A1*   3/2017   Baek ................... H01L 23/5222
(Continued)

OTHER PUBLICATIONS

Non-Final Office Action dated Sep. 16, 2021 for U.S. Appl. No. 16/876,432.

(Continued)

*Primary Examiner* — Patricia D Valenzuela
(74) *Attorney, Agent, or Firm* — Eschweiler & Potashnik, LLC

(57) ABSTRACT

Some embodiments relate to a semiconductor structure including a conductive wire disposed within a first dielectric structure. An etch stop layer overlies the first dielectric structure. A dielectric capping layer is disposed between an upper surface of the conductive wire and the etch stop layer. An upper dielectric layer is disposed along sidewalls of the conductive wire and an upper surface of the etch stop layer. The upper dielectric layer contacts an upper surface of the dielectric capping layer and has a top surface vertically above the etch stop layer.

20 Claims, 13 Drawing Sheets

Related U.S. Application Data

(60) Provisional application No. 62/949,545, filed on Dec. 18, 2019.

(51) Int. Cl.
*H01L 23/528* (2006.01)
*H01L 21/764* (2006.01)

(52) U.S. Cl.
CPC ........ *H01L 23/528* (2013.01); *H01L 23/5283* (2013.01); *H01L 23/53295* (2013.01)

(58) Field of Classification Search
CPC ......... H01L 21/76849; H01L 21/76826; H01L 21/76832; H01L 21/76834; H01L 2221/1042; H01L 23/5283; H01L 21/764
See application file for complete search history.

(56) References Cited

U.S. PATENT DOCUMENTS

| | | |
|---|---|---|
| 2017/0317027 A1 | 11/2017 | Chen et al. |
| 2017/0317143 A1* | 11/2017 | Chen .................. H10N 70/8833 |
| 2018/0122738 A1* | 5/2018 | Wu ...................... H01L 23/5329 |
| 2019/0210061 A1 | 7/2019 | Ke et al. |
| 2019/0244896 A1* | 8/2019 | Lee ..................... H01L 23/5226 |
| 2020/0185325 A1* | 6/2020 | Lin ..................... H01L 23/5283 |

OTHER PUBLICATIONS

Notice of Allowance dated Jan. 7, 2022 for U.S. Appl. No. 16/876,432.

\* cited by examiner

DIELECTRIC CAPPING STRUCTURE OVERLYING A CONDUCTIVE STRUCTURE TO INCREASE STABILITY

REFERENCE TO RELATED APPLICATIONS

This Application is a Divisional of U.S. application Ser. No. 16/876,432, filed on May 18, 2020, which claims the benefit of U.S. Provisional Application No. 62/949,545, filed on Dec. 18, 2019. The contents of the above-referenced Patent Applications are hereby incorporated by reference in their entirety.

BACKGROUND

As dimensions and feature sizes of semiconductor integrated circuits (ICs) are scaled down, the density of the elements forming the ICs is increased and the spacing between elements is reduced. Such spacing reductions are limited by light diffraction of photo-lithography, mask alignment, isolation and device performance among other factors. As the distance between any two adjacent conductive features decreases, the resulting capacitance increases, which will increase power consumption and time delay.

To reduce parasitic capacitance and correspondingly improve device performance, IC designers utilize low-k dielectrics. One kind of low-k dielectric is produced by doping silicon oxide ($SiO_2$) with impurities. For example, while pure $SiO_2$ has a dielectric constant of 3.9, fluorinated silica glass in which $SiO_2$ has been doped with fluorine has a dielectric constant of 3.5. Further, $SiO_2$ which has been doped with carbon can have a dielectric constant that is further lowered to about 3.0. Another kind of low-k material is produced by creating large voids or pores in a dielectric. Voids can have a dielectric constant of nearly 1, thereby reducing the dielectric constant of the porous material by increasing the porosity of the material. Large pores, also referred to as air-gaps, can provide an extremely low-k dielectric between the two conductive features.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
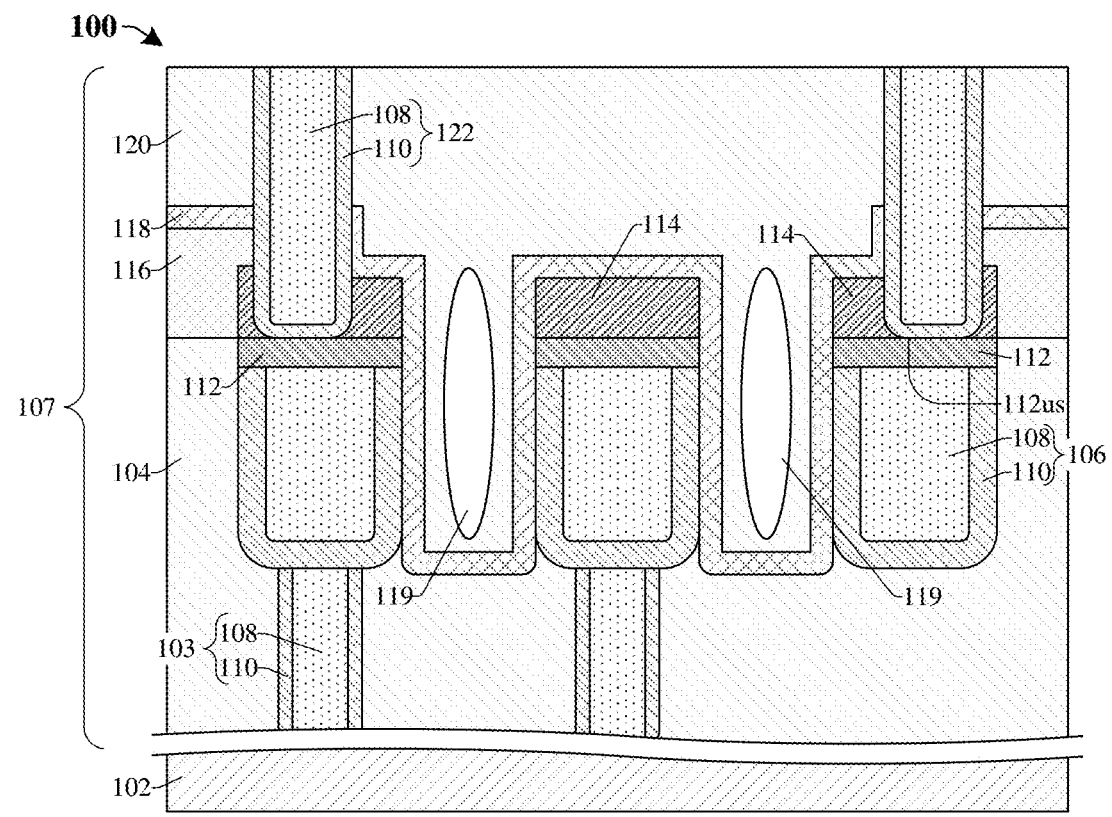
FIG. 1 illustrates a cross-sectional view of some embodiments of an integrated chip having a dielectric capping layer overlying conductive wires and air-gaps disposed between adjacent conductive wires.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips may include a number of semiconductor devices (e.g., transistors, memory devices, etc.) disposed over and/or within a semiconductor substrate. An interconnect structure may be disposed over the semiconductor substrate. The interconnect structure may include conductive interconnect layers having conductive wires and conductive vias disposed within an interconnect dielectric structure. The conductive wires and conductive vias are configured to provide electrical pathways between different semiconductor devices disposed within and/or over the semiconductor substrate. Further, air-gaps are formed in the interconnect dielectric structure between adjacent conductive features, for example between two adjacent conductive wires, to lower a k-value of the interconnect dielectric structure. By reducing the k-value of the interconnect dielectric structure, the air-gaps can reduce a capacitance between the two adjacent conductive wires and reduce a resistance capacitance (RC) delay in the interconnect structure.

The conductive interconnect layers of the interconnect structure may be formed by a single or dual damascene process. For example, a layer of conductive wires may be formed within a lower inter-level dielectric (ILD) structure over the semiconductor substrate. Subsequently, a conductive capping layer is formed along a top surface of each conductive wire. In some embodiments, the conductive capping layer is configured to prevent diffusion of a material (e.g., copper) out of the conductive wires. A dielectric layer is formed over the conductive wires. A patterning process is performed on the dielectric layer and the lower ILD structure to define a plurality of air-gaps between adjacent conductive wires. Further, an upper ILD structure is formed over the conductive wires such that the air-gaps remain between the adjacent conductive wires. However, the patterning process may include exposing the conductive wires and the conductive capping layers to one or more fluorine-based etchants (e.g., carbon tetrafluoride (e.g., $CF_4$), sulfur hexafluoride (e.g., $SF_6$, etc.) and/or chlorine-based etchants (e.g., boron chloride (e.g, $BCl_3$), chloride gas ($Cl_2$), etc.). The one or more chlorine-based etchants may react with the conductive capping layers and/or conductive wires, thereby resulting in the formation of metal ions that may easily diffuse to other conductive elements and/or dielectric elements within the interconnect structure. This may result in time dependent dielectric breakdown (TDDB) of the interconnect dielectric structure, damage to the conductive wires and/or conductive capping layers (e.g., delamination and/or over-etching of the conductive wires and conductive capping layers), and/or formation of leakage paths between adjacent conductive wires within the interconnect structure, thereby reducing a reliability and performance of the interconnect structure.

Accordingly, some embodiments of the present disclosure are related to an interconnect structure comprising a capping structure with a dielectric capping layer and a conductive capping layer disposed along a top surface of a conductive wire. Further, a method for forming the interconnect structure according to the present disclosure includes forming a plurality of conductive wires within a lower ILD structure. A conductive capping layer is formed along a top surface of each conductive wire. Subsequently, a self-assembled monolayer (SAM) is selectively deposited over an upper surface of the lower ILD structure such that the SAM is laterally offset from a top surface of each conductive capping layer. A dielectric capping layer is selectively deposited along the top surface of each conductive capping layer. The SAM is configured to prevent deposition of the dielectric capping layer along the upper surface of the lower ILD structure. An etch stop layer is formed over the conductive wires. A patterning process is performed on the etch stop layer and the first ILD structure to define a plurality of air-gaps between adjacent conductive wires. The patterning process may include exposing the conductive wires and the conductive capping layers to, for example, one or more fluorine-based etchants (e.g., carbon tetrafluoride (e.g., $CF_4$), sulfur hexafluoride (e.g., $SF_6$, etc.) and/or chlorine-based etchants (e.g., boron chloride (e.g., $BCl_3$), chloride gas ($Cl_2$), etc.). The dielectric capping layer is configured to prevent damage to the conductive capping layer and/or the conductive wires by the chlorine-based etchants, thereby mitigating a formation of metal ions during the patterning process. Further, an upper ILD structure is formed over the conductive wires such that the air-gaps remain between the adjacent conductive wires. Thus, the air-gaps may be formed between adjacent conductive wires while preventing damage to the conductive capping layer and/or the conductive wires. This, in turn, reduces a capacitance between the adjacent conductive wires and an RC delay in the interconnect structure while preventing damage to the conductive capping layer and conductive wires, thereby increasing a performance and reliability of the interconnect structure.

FIG. 1 illustrates a cross-sectional view of some embodiments of an integrated chip 100 having a dielectric capping layer 114 overlying conductive wires 106 and air-gaps 119 disposed between adjacent conductive wires 106.

The integrated chip 100 includes an interconnect structure 107 overlying a substrate 102. The interconnect structure 107 includes an interconnect dielectric structure, a plurality of conductive contacts 103, a plurality of conductive wires 106, and a plurality of conductive vias 122. In further embodiments, the interconnect structure 107 may be referred to as a back-end-of-the-line (BEOL) structure such that the conductive contacts 103 may be referred to as a first BEOL metallization layer, the conductive wires 106 may be referred to as a second BEOL metallization layer, and/or the conductive vias 122 may be referred to as a third BEOL metallization layer. In some embodiments, the interconnect dielectric structure includes a first inter-level dielectric (ILD) structure 104, an etch stop layer 116, an upper dielectric layer 118, and a second ILD structure 120. The conductive contacts 103 comprise a conductive body 108 and a conductive liner 110 and are disposed within the first ILD structure 104. In some embodiments, the conductive liner 110 may be configured to reduce and/or prevent diffusion of a diffusive species (e.g., copper and/or aluminum) from the conductive body 108. Further, the conductive contacts 103 may be configured to electrically couple overlying conductive layers (e.g., conductive wires 106 and/or conductive vias 122) to a plurality of semiconductor devices (e.g., transistors, varactors, etc.) (not shown) disposed over and/or within the substrate 102 and/or doped regions of the substrate 102.

The conductive wires 106 overlie the conductive contacts 103 and are disposed within the first ILD structure 104. The conductive wires 106 respectively comprises a conductive body 108 and a conductive liner 110. In some embodiments, a width of the conductive body 108 of the conductive wires 106 is greater than a width of the conductive body 108 of the conductive contacts 103. A conductive capping layer 112 is disposed along an upper surface of each conductive wire 106. The conductive capping layer 112 is configured to reduce and/or prevent diffusion of the diffusive species from the conductive body 108 to surrounding structures, such as the first and second ILD structures 104, 120. Further, a dielectric capping layer 114 is disposed along an upper surface of the conductive capping layer 112. The etch stop layer 116 overlies the first ILD structure 104. The upper dielectric layer 118 extends from an upper surface of the dielectric capping layer 114 to sidewalls of the conductive capping layer 112 and sidewalls of the conductive wires 106. The second ILD structure 120 overlies the upper dielectric layer 118 and comprises a plurality of air-gaps 119. In some embodiments, the air-gaps 119 may be referred to as voids, pores, openings, or the like. The air-gaps 119 are disposed between adjacent conductive wires 106 and are configures to reduce an overall k-value of the interconnect dielectric structure. For example, the air-gaps 119 may reduce the k-value of the second ILD structure 120, thereby reducing a capacitance between the adjacent conductive wires 106 and improving an RC delay in the interconnect structure 107. Further the conductive vias 122 are disposed within the second ILD structure 120 and overlie the conductive wires 106. In some embodiments, the conductive vias 122 respectively comprise the conductive body 108 and the conductive liner 110.

In some embodiments, during fabrication of the integrated chip 100, an etching process is performed into the first ILD structure 104 to define openings between adjacent conductive wires 106. The etching process may include exposing the first ILD structure 104 to, for example, one or more fluorine-based etchants (e.g., carbon tetrafluoride (e.g., $CF_4$), sulfur hexafluoride (e.g., $SF_6$, etc.) and/or chlorine-based etchants (e.g., boron chloride (e.g., $BCl_3$), chloride gas ($Cl_2$), another chlorine-based etchant, or any combination of the foregoing). The dielectric capping layer 114 is configured to prevent the fluorine-based etchants and/or chlorine-based etchants from damaging the conductive capping layer 112 and/or the conductive wires 106, thereby mitigating a formation of metal ions during the etching process. Further, the second ILD structure 120 is formed in such a manner that the air-gaps 119 are defined in the second ILD structure 120 between the adjacent conductive wires 106. Thus, the air-gaps 119 may be formed between adjacent conductive wires 106 while preventing damage to the conductive capping layer 112 and/or the conductive wires 106. This, in turn, reduces a capacitance between the adjacent conductive wires 106 and reduces an RC delay in the interconnect structure 107 while preventing damage to the conductive capping layer 112 and conductive wires 106, thereby increasing a performance and reliability of the interconnect structure 107.

Figure 2A:
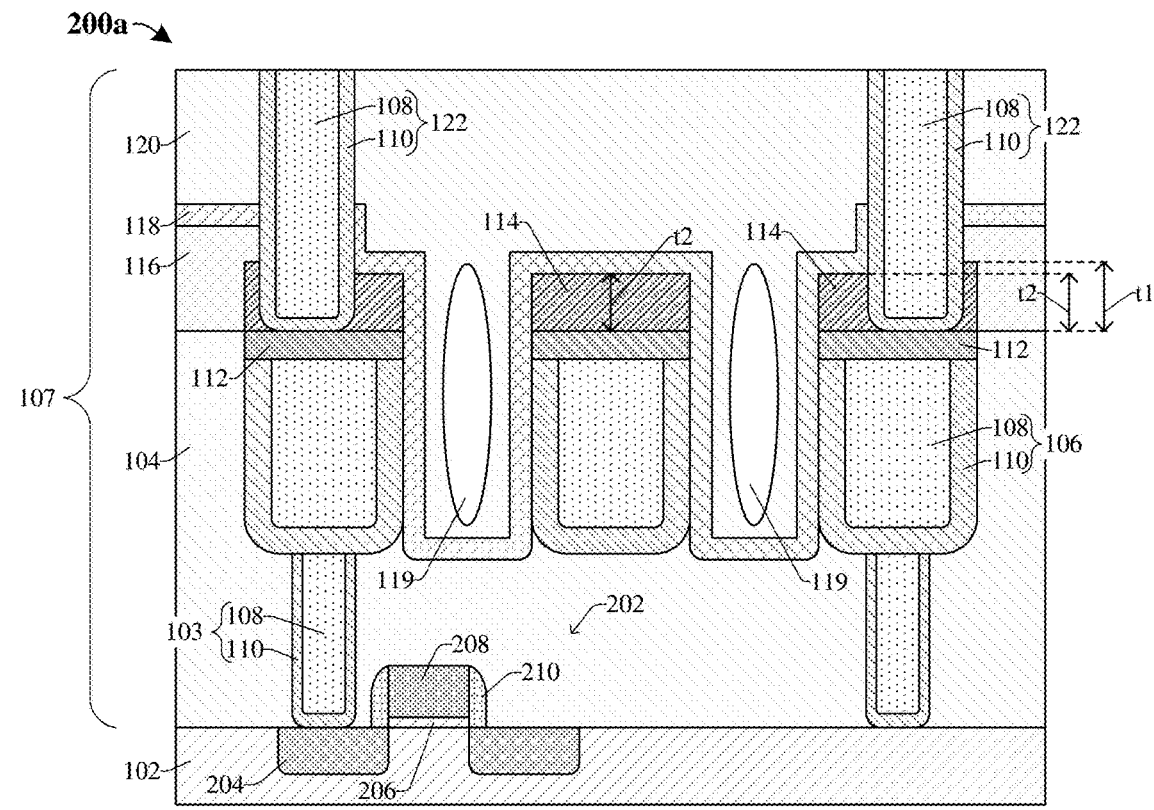
FIGS. 2A-2D and 3A-3B illustrate cross-sectional views of some alternative embodiments of an integrated chip having a dielectric capping layer overlying conductive wires and air-gaps disposed between adjacent conductive wires.

FIG. 2A illustrates a cross-sectional view of some embodiments of an integrated chip 200a having a dielectric capping layer 114 and a conductive capping layer 112 over conductive wires 106.

The integrated chip 200a includes an interconnect structure 107 overlying a substrate 102. The interconnect structure 107 includes metallization layers (e.g., the conductive contacts 103, the conductive wires 106, the conductive vias 122, etc.) disposed within an interconnect dielectric structure. The metallization layers are configured to electrically couple a semiconductor device 202 disposed within and/or over the substrate 102 to other semiconductor devices (not shown) and/or doped regions (not shown). In some embodiments, the substrate 102 may, for example, be or comprise a bulk semiconductor substrate (e.g., bulk silicon), a silicon-on-insulator (SOI) substrate, or another suitable substrate material. The interconnect dielectric structure includes the first ILD structure 104, the etch stop layer 116, the upper dielectric layer 118, and the second ILD structure 120. In some embodiments, the semiconductor device 202 may be configured as a transistor. In such embodiments, the semiconductor device 202 comprises source/drain regions 204, a gate dielectric layer 206, a gate electrode 208, and a sidewall spacer structure 210. The gate dielectric layer 206 is disposed between the gate electrode 208 and the substrate 102. The source/drain regions 204 are disposed within the substrate 102 on opposing sides of the gate electrode 208. Further, the sidewalls spacer structure 210 is disposed along sidewalls of the gate electrode 208 and the gate dielectric layer 206.

The metallization layers disposed within the interconnect structure 107 include a plurality of conductive contacts 103 disposed within the first ILD structure 104. The conductive contacts 103 each include a conductive body 108 and a conductive liner 110. In some embodiments, the conductive body 108 may, for example, be or comprise aluminum, copper, cobalt, ruthenium, another suitable conductive material, or any combination of the foregoing. In further embodiments, the conductive liner 110 may, for example, be or comprise titanium nitride, tantalum nitride, another suitable material, or any combination of the foregoing.

A plurality of conductive wires 106 is disposed over the conductive contacts 103. The conductive wires 106 each comprise the conductive body 108 and the conductive liner 110. In some embodiments, the conductive wires 106 are disposed within a bottommost layer of conductive wires within the interconnect structure 107. For example, in such embodiments, other conductive wires (not shown) are not disposed between the conductive wires 106 and the substrate 102. The conductive capping layer 112 overlies each conductive wire 106. In some embodiments, the conductive capping layer 112 may, for example, be or comprise copper, cobalt, ruthenium, molybdenum, chromium, tungsten, manganese, rhodium, iridium, nickel, palladium, platinum, silver, gold, aluminum, another suitable conductive material, or any combination of the foregoing. In further embodiments, a thickness of the conductive capping layer 112 may be within a range of about 2 to 50 Angstroms, or another suitable value. In various embodiments, the conductive capping layer 112 is configured to reduce and/or prevent diffusion of a material (e.g., copper and/or aluminum) from the conductive body 108 of each conductive wire 106 to surrounding structures, such as the first and/or second ILD structures 104, 120. For example, during operation and/or fabrication of the integrated chip 200a, a heat within the interconnect structure 107 may increase, thereby promoting or facilitating diffusion of the material (e.g., copper and/or aluminum) from the conductive body 108 to the first and second ILD structures 104, 120 and/or another adjacent structure. By virtue of the conductive capping layer 112 extending across an upper surface of each conductive wire 106, diffusion of the material from the conductive body 108 may be mitigated. This increases a reliability of the integrated chip 200a.

A dielectric capping layer 114 overlies the conductive capping layer 112. In some embodiments, the dielectric capping layer 114 may, for example, be or comprise aluminum nitride, aluminum oxynitride, aluminum oxide (e.g., $Al_2O_3$), silicon oxycarbide, silicon carbon nitride, silicon nitride, silicon carbon oxynitride, silicon dioxide, silicon carbide, silicon oxynitride, another suitable dielectric material, or any combination of the foregoing. In various embodiments, a thickness of the dielectric capping layer 114 may, for example, be within a range of about 2 to 100 Angstroms or another suitable thickness value. Further, during fabrication of the interconnect structure 107, the dielectric capping layer 114 is configured to prevent damage to the conductive capping layer 112 and/or the conductive wires 106 from one or more fluorine-based etchants (e.g., carbon tetrafluoride (e.g., $CF_4$), sulfur hexafluoride (e.g., $SF_6$), etc.) and/or chlorine-based etchants (e.g., boron chloride (e.g., $BCl_3$), chloride gas ($Cl_2$), another chlorine-based etchant, or any combination of the foregoing). This, in part, increases a reliability and endurance of the interconnect structure 107.

An etch stop layer 116 overlies the first ILD structure 104 and the dielectric capping layer 114. An upper dielectric layer 118 extends from an upper surface of the dielectric capping layer 114 to sidewalls of the conductive capping layer 112 and sidewalls of the conductive wires 106. In some embodiments, the etch stop layer 116 and/or the upper dielectric layer 118 may, for example, respectively be or comprise silicon oxycarbide, silicon carbon nitride, silicon nitride, silicon carbon oxynitride, silicon dioxide, silicon carbide, silicon oxynitride, aluminum nitride, aluminum oxynitride, aluminum oxide, another suitable dielectric material, or any combination of the foregoing. In further embodiments, a thickness of the etch stop layer 116 and/or the upper dielectric layer 118 may respectively be within a range of about 5 to 200 Angstroms or another suitable thickness value. The second ILD structure 120 overlies the first ILD structure 104 and a plurality of conductive vias 122 are disposed within the second ILD structure 120. The conductive vias 122 each comprise the conductive body 108 and the conductive liner 110. Further, the conductive vias 122 may extend through the dielectric capping layer 114 to contact an underlying conductive capping layer 112.

The first and second ILD structures 104, 120 may, for example, respectively be or comprise silicon dioxide, hydrogen-containing silicon oxycarbide (SiCOH), a low-k dielectric material, an extreme low-k dielectric material, another suitable dielectric material, or any combination of the foregoing. An effective dielectric constant of the first and second ILD structures 104, 120 is a function of the dielectric material the layers are comprised of and the physical structure of the layers. For example, the second ILD structure 120 may have porosity and a plurality of air-gaps 119 that reduces the effective dielectric constant of the second ILD structure 120. In some embodiments, porosity is void space that is distributed throughout the dielectric material, whereas air-gaps are larger voids in the dielectric layer that would otherwise be filled by the dielectric material. In further embodiments, the first ILD structure 104 may comprise air-gaps (not shown) and/or may be porous, thereby reducing an effective dielectric constant of the first ILD structure 104. In some embodiments, the first ILD structure 104 and/or the second ILD structure 120 may respectively have an effective dielectric constant within a range of about 2 to 3.6 or another suitable range. In yet further embodiments, a porosity of the first ILD structure 104 and/or the second ILD structure 120 may, for example, respectively be within a range of about 0.1% to 40% or another suitable value. Thus, by introducing the air-gaps 119 between adjacent conductive wires 106, a capacitance between the adjacent conductive wires 106 is decreased and a performance of the interconnect structure 107 is increased. This, in part, is because a dielectric constant of each air-gap 119 is about 1. In some embodiments, if the porosity of the first and/or second ILD structures 104, 120 is relatively low (e.g., less than about 0.1%), then an effective dielectric constant of the first and/or second ILD structures 104, 120 is not sufficiently decreased such that capacitance between adjacent conductive wires 106 may be increased, thereby decreasing performance of the integrated chip 200a. In further embodiments, if the porosity of the first and/or second ILD structures 104, 120 is relatively high (e.g., greater than about 40%), then a structural integrity of the first and/or second ILD structures 104, 120 is decreased and the first and/or second ILD structures 104, 120 are more susceptible to etch damage.

In some embodiments, a thickness of the dielectric capping layer 114 discretely decreases from a first thickness t1 to a second thickness t2 in a direction towards the plurality of air-gaps 119. In such embodiments, the second thickness t2 is less than the first thickness t1. In yet further embodiments, a center segment of the dielectric capping layer 114 disposed laterally between an adjacent pair of air-gaps 119 comprises the second thickness t2.

Figure 2B:
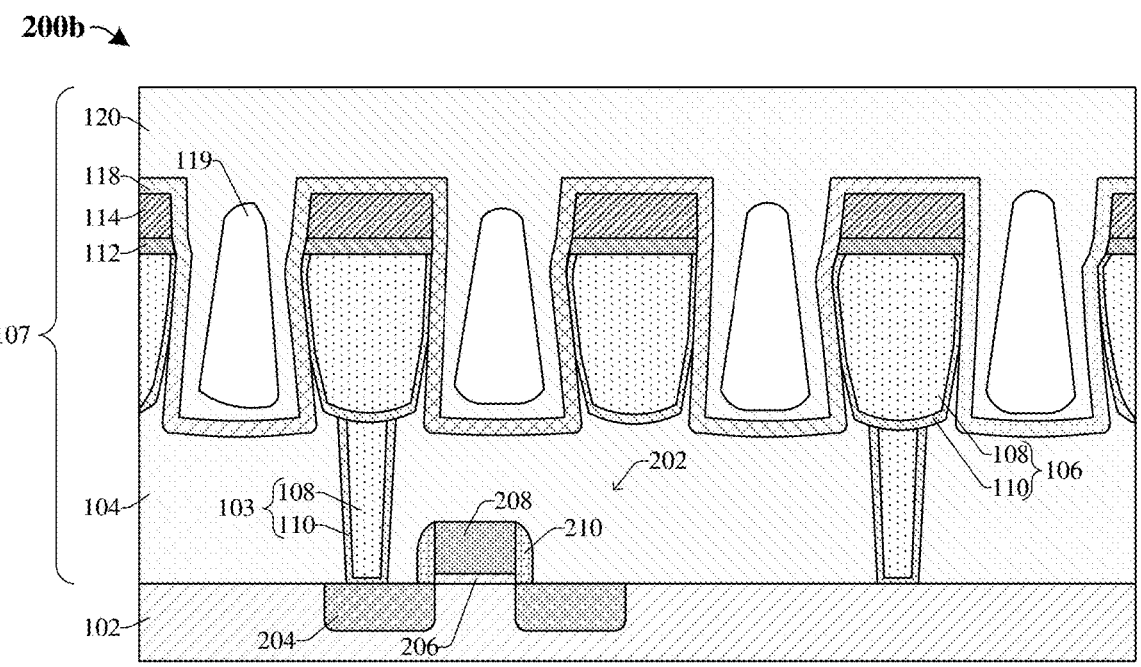

FIG. 2B illustrates a cross-sectional view of some embodiments of an integrated chip 200b according to some alternative embodiments of the integrated chip 200a of FIG. 2A, in which a lower surface of each conductive wire 106 is curved. Further, a width of each air-gap 119 continuously decreases from a top surface of the air-gap 119 in a direction towards the substrate 102.

Figure 2C:
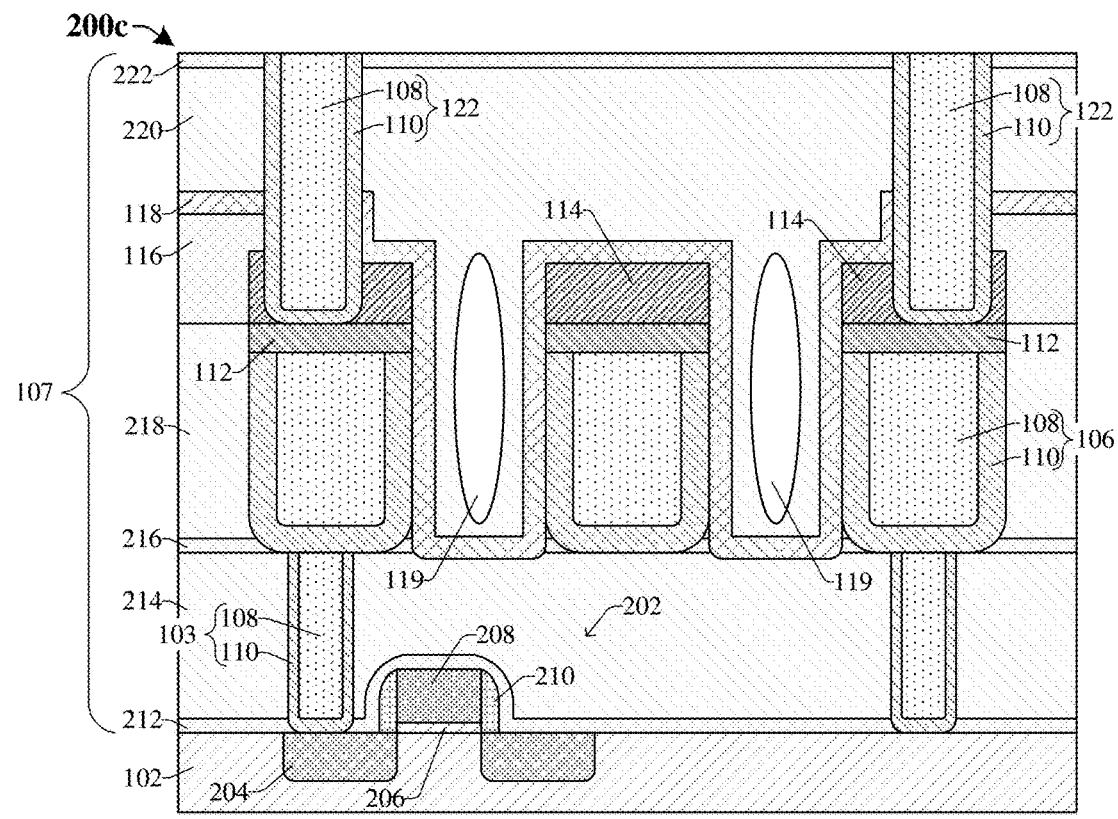

FIG. 2C illustrates a cross-sectional view of some embodiments of an integrated chip 200c according to some alternative embodiments of the integrated chip 200a of FIG. 2A.

In some embodiments, a contact etch stop layer 212 is disposed between the substrate 102 and a first ILD layer 214. A lower etch stop layer 216 overlies the first ILD layer 214 and a second ILD layer 218 overlies the lower etch stop layer 216. A third ILD layer 220 overlies the upper dielectric layer 118 and comprises the air-gaps 119. Further, an upper etch stop layer 222 overlies the third ILD layer 220. In some embodiments, the contact etch stop layer 212, the lower etch stop layer 216, and the upper etch stop layer 222 may, for example, respectively be or comprise silicon nitride, silicon carbide, silicon oxynitride, silicon oxycarbide, another dielectric material, or any combination of the foregoing and/or may have a thickness within a range of 5 to 200 Angstroms or another suitable thickness value. In further embodiments, the first ILD layer 214, the second ILD layer 218, and the third ILD layer 220 may, for example, respectively be or comprise silicon dioxide, hydrogen-containing silicon oxycarbide (SiCOH), a low-k dielectric material, an extreme low-k dielectric material, another suitable dielectric material, or any combination of the foregoing. In yet further embodiments, a porosity of the first ILD layer 214, the second ILD layer 218, and the third ILD layer 220 may, for example, respectively be within a range of about 0.1% to 40% or another suitable value such that each layer may have an effective dielectric constant within a range of about 2 to 3.6 or another suitable value.

Figure 2D:
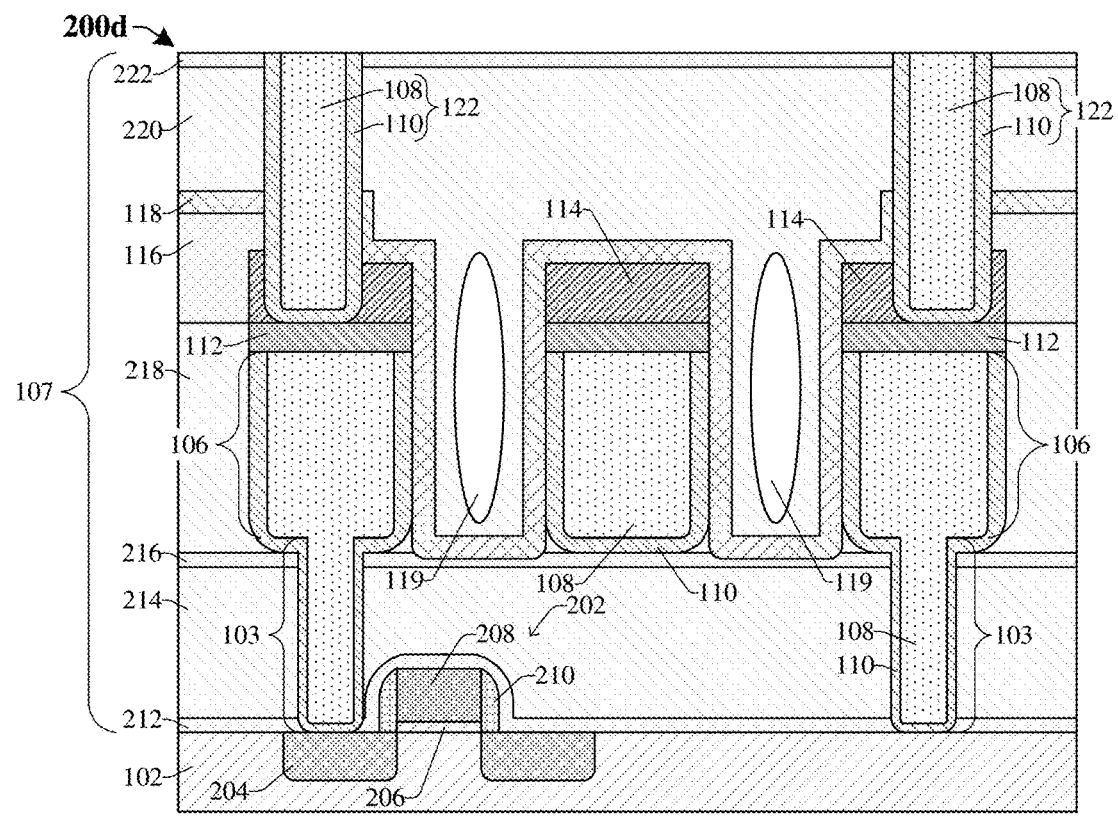

FIG. 2D illustrates a cross-sectional view of some embodiments of an integrated chip 200d according to some alternative embodiments of the integrated chip 200c of FIG. 2C, in which each conductive wire 106 directly overlying a conductive contact 103 share a conductive body 108 and a conductive liner 110. This, in some embodiments, may be because the conductive contacts 103 and the conductive wires 106 are formed concurrently by a dual damascene process.

Figure 3A:
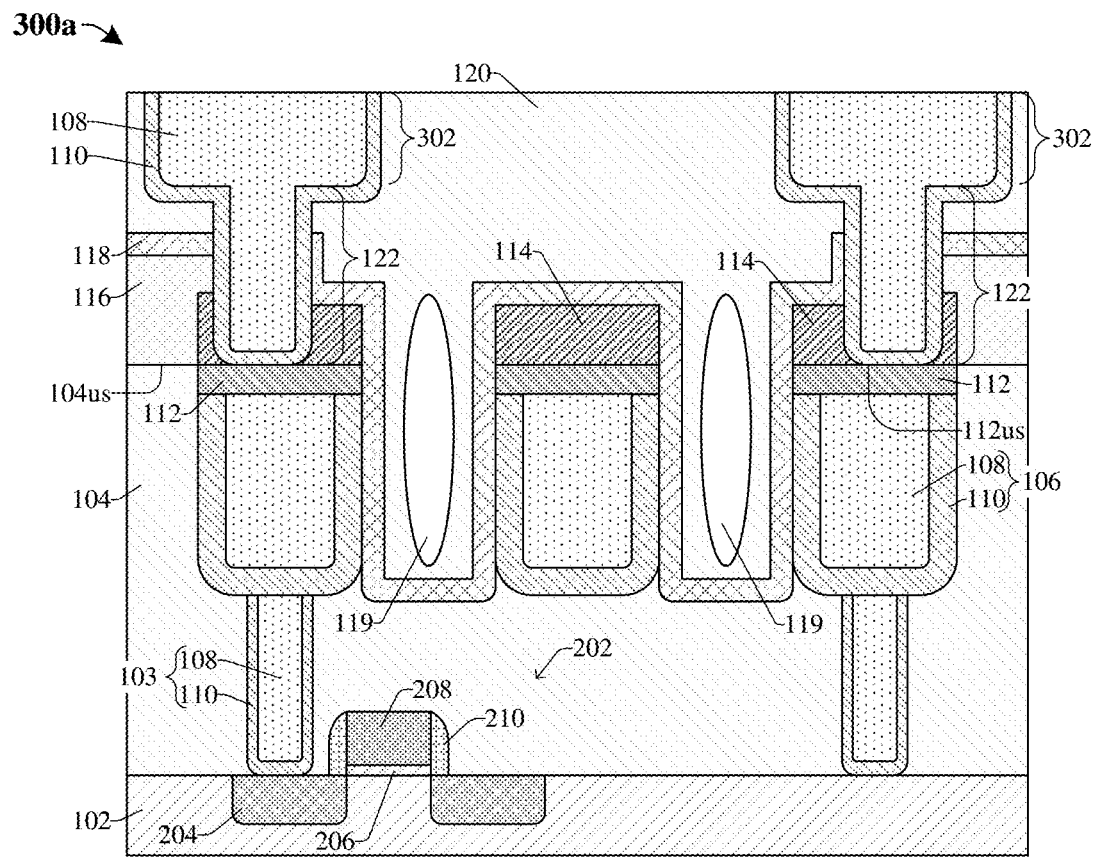

FIG. 3A illustrates a cross-sectional view of some embodiments of an integrated chip 300a according to some alternative embodiments of the integrated chip 200a of FIG. 2A, in which a plurality of upper conductive wires 302 is disposed within the second ILD structure 120 and overlies the conductive vias 122. In some embodiments, the conductive vias 122 and the upper conductive wires 302 share a conductive body 108 and a conductive liner 110. This, in some embodiments, may be because the conductive vias 122 and the upper conductive wires 302 are formed concurrently by a dual damascene process.

Figure 3B:
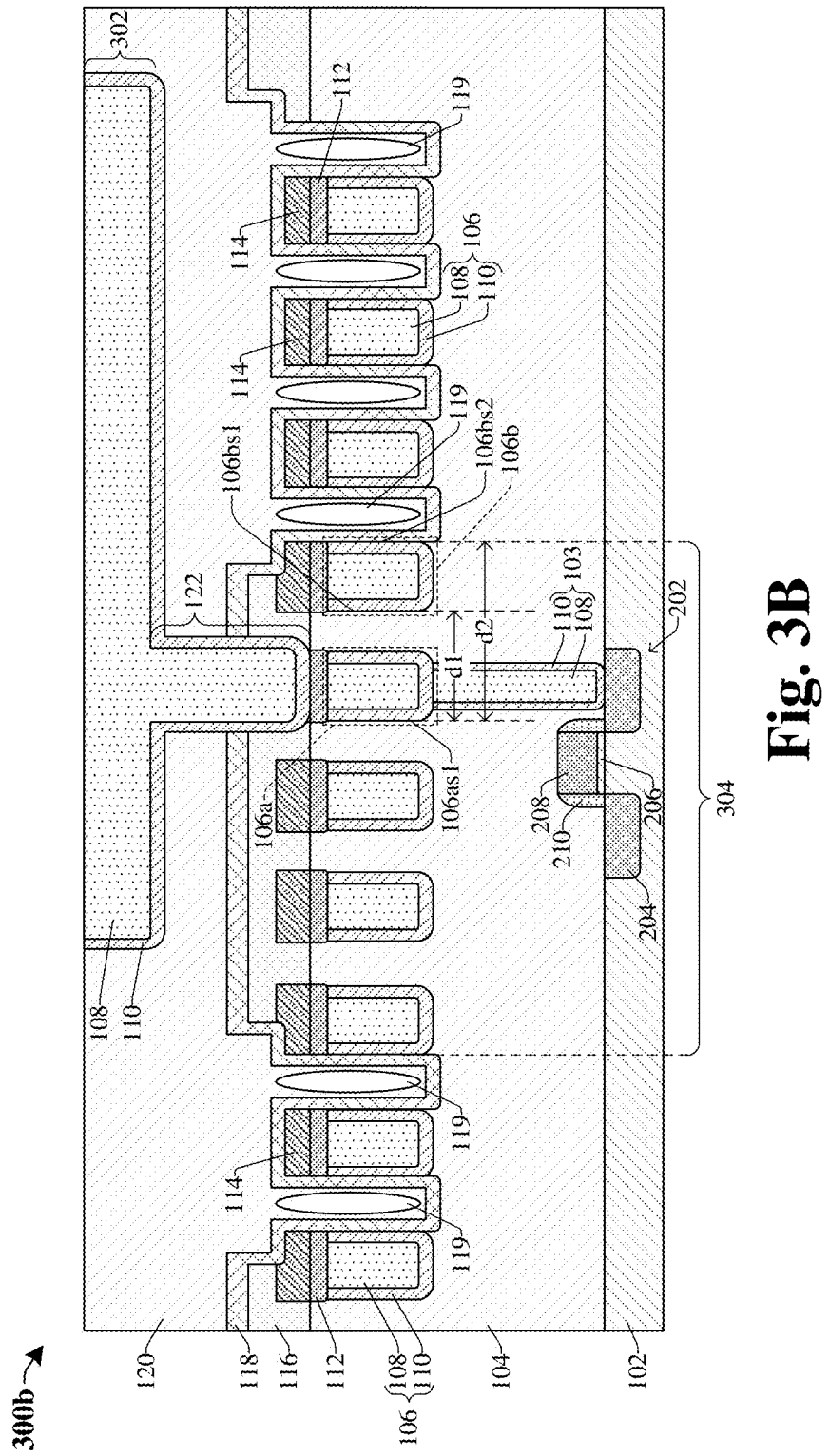

FIG. 3B illustrates a cross-sectional view of some embodiments of an integrated chip 300b according to some alternative embodiments of the integrated chip 300a of FIG. 3A, in which the plurality of air-gaps 119 are laterally offset from a conductive via landing region 304. A first distance d1 is defined between a first sidewall 106as1 of a first conductive wire 106a and a first sidewall 106bs1 of a second conductive wire 106b, in which the second conductive wire 106b is laterally adjacent to an air-gap 119. Further, a second distance d2 is defined between the first sidewall 106as1 of the first conductive wire 106a and a second sidewall 106bs2 of the second conductive wire 106b. In some embodiments, the first sidewall 106b1 of the second conductive wire 106b is opposite the second sidewall 106b2 of the second conductive wire 106b. In further embodiments, the second distance d2 is at least 1.5 times greater than the first distance d1. In some embodiments, if the second distance d2 is relatively small (e.g., less than about 1.5*d1), then the second ILD structure 120 may be damaged by an etch process utilized to form the conductive via 122. This, in part, may be because the etch process may over-etch into an air-gap 119 that is laterally adjacent to the second conductive wire 106b, thereby reducing a structural integrity of the second ILD structure 120 and/or shorting adjacent conductive wires 106 to one another. Thus, in some embodiments, a lateral distance of the conductive via landing region 304 is at least 2 times greater than the first distance d1. In further embodiments, if the lateral distance of the conductive via landing region 304 is relatively small (e.g., less than about 2\*d1), then the second ILD structure 120 may be damaged by the etch process utilized to form the conductive via 122.

FIGS. 4-13 illustrate cross-sectional views 400-1300 of some embodiments of a method of forming an interconnect structure having a dielectric capping layer overlying conductive wires and air-gaps disposed between adjacent conductive wires. Although the cross-sectional views 400-1300 shown in FIGS. 4-13 are described with reference to a method, it will be appreciated that the structures shown in FIGS. 4-13 are not limited to the method but rather may stand alone separate of the method. Furthermore, although FIGS. 4-13 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 4:
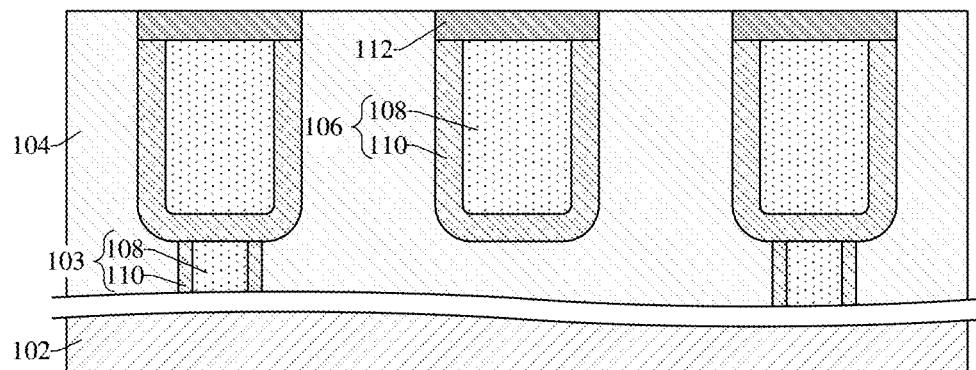
FIGS. 4-13 illustrate cross-sectional views of some embodiments of a method of forming an integrated chip having a dielectric capping layer overlying conductive wires and air-gaps disposed between adjacent conductive wires.

As shown in cross-sectional view 400 of FIG. 4, a plurality of conductive contacts 103 is formed over a substrate 102 and within a first inter-level dielectric (ILD) structure 104. In some embodiments, the substrate 102 may, for example, be or comprise a bulk substrate (e.g., a bulk silicon substrate), a silicon-on-insulator (SOI) substrate, or another suitable material. In further embodiments, each conductive contact 103 includes a conductive body 108 and a conductive liner 110 laterally surrounding the conductive body 108. In some embodiments, the conductive liner 110 may be configured as a diffusion barrier layer and/or may, for example, be or comprise titanium nitride, tantalum nitride, another material, or any combination of the foregoing. In some embodiments, the conductive contacts 103 may be formed by a dual damascene process or a single damascene process. In further embodiments, the conductive contacts 103 are disposed within a first metallization layer formed in an interconnect structure overlying the substrate 102 (e.g., see FIG. 2A). In further embodiments, the conductive contacts 103 may directly overlie, be directly electrically coupled to, and/or directly contact doped regions disposed within the substrate 102 and/or semiconductor devices (not shown) (e.g., transistors) disposed within/over the substrate 102.

In some embodiments, a single damascene process for forming the conductive contacts 103 may include: depositing the first ILD structure 104 (e.g., by chemical vapor deposition (CVD), physical vapor deposition (PVD), atomic layer deposition (ALD), plasma enhanced CVD (PECVD), or another suitable deposition or growth process) over the substrate 102; patterning the first ILD structure 104 to define a lower conductive feature opening within the first ILD structure 104; depositing (e.g., by CVD, PVD, sputtering, electroless plating, etc.) a liner layer within the conductive feature opening and depositing (e.g., by CVD, PVD, sputter, electroless plating, etc.) a conductive material over the liner layer, thereby filling the lower conductive feature opening; and performing a planarization process (e.g., a chemical mechanical planarization (CMP) process) into the conductive material and/or the liner layer, thereby defining the conductive body 108 and the conductive liner 110 of the conductive contacts 103.

Further, as illustrated in the cross-sectional view 400 of FIG. 4, a plurality of conductive wires 106 are formed over the conductive contacts 103. In some embodiments, each conductive wire 106 comprises a conductive body 108 and a conductive liner 110 laterally enclosing the conductive body 108 of the conductive wire 106. In some embodiments, the conductive wires 106 may be formed by a single damascene process or a dual damascene process. Further, a conductive capping layer 112 is formed along an upper surface of each conductive wire 106, such that the conductive capping layer 112 and the conductive wires 106 are disposed within the first ILD structure 104. In further embodiments, the conductive wires 106 are disposed within a second metallization layer formed in an interconnect structure overlying the substrate 102 (e.g., see FIG. 2A). In such embodiments, the conductive wires 106 are a first layer of conductive wires disposed over the substrate 102.

In some embodiments, the conductive capping layer 112 may, for example, be deposited by CVD, PVD, ALD, or another suitable growth or deposition process. In some embodiments, the conductive capping layer 112 may, for example, be or comprise copper, cobalt, ruthenium, molybdenum, chromium, tungsten, manganese, rhodium, iridium, nickel, palladium, platinum, silver, gold, aluminum, another suitable conductive material, or any combination of the foregoing. In further embodiments, the conductive capping layer 112 may be formed to a thickness within a range of about 2 to 50 Angstroms, or another suitable thickness value. In yet further embodiments, the conductive contacts 103 and the conductive wires 106 may be formed concurrently by a dual damascene process (e.g., see FIG. 2D).

Figure 5A:
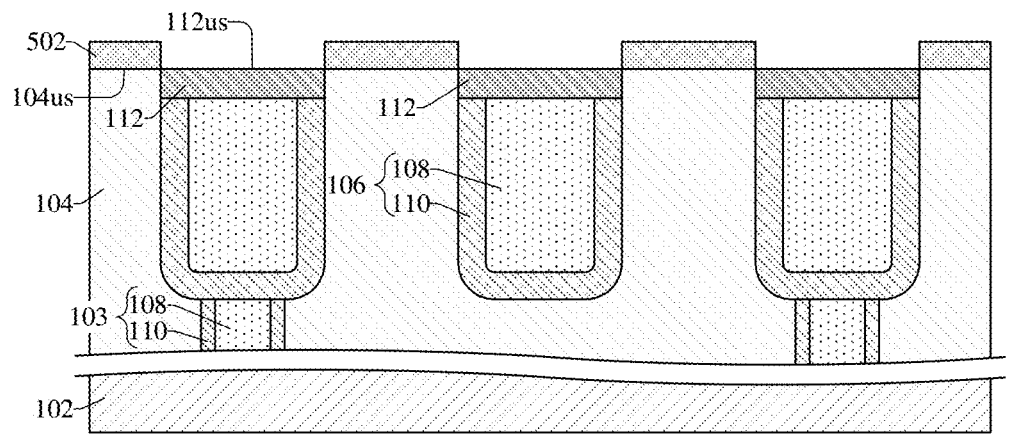

As shown in cross-sectional view 500 of FIG. 5A, a self-assembled monolayer (SAM) 502 is selectively deposited along an upper surface 104us of the first ILD structure 104. In some embodiments, the SAM 502 is referred to as a blocking layer. In some embodiments, the SAM 502 comprises a head group that adheres or bonds to the first ILD structure 104 but not to the conductive capping layer 112. In some embodiments, the SAM 502 may be deposited onto the first ILD structure 104 by spin coating. In further embodiments, a process for forming the SAM 502 includes spinning the SAM 502 onto the structure of FIG. 4, upon being spun onto the structure of FIG. 4 the SAM 502 will adhere to the first ILD structure 104 but not to the conductive capping layer 112. Thus, the SAM 502 is laterally offset from an upper surface 112us of the conductive capping layer 112. In some embodiments, the SAM 502 may be formed to a thickness within a range of about 2 to 50 Angstroms or to another suitable thickness value. In yet further embodiments, the SAM 502 may be formed by ALD, CVD, spin on, a dipping process, or another suitable deposition or growth process. In yet further embodiments, before selectively depositing the SAM 502, a surface treatment process may be performed on the first ILD structure 104 to remove impurities from the upper surface 104us of the first ILD structure 104 and/or prepare the upper surface 104us of the first ILD structure 104 for the selective deposition of the SAM 502. In yet further embodiments, the surface treatment process may, for example, include a wet etch process, a dry etch process, a baking process, another suitable process, or any combination of the foregoing. In further embodiments, the surface treatment process may reduce a thickness of the first ILD structure 104.

Figure 5B:
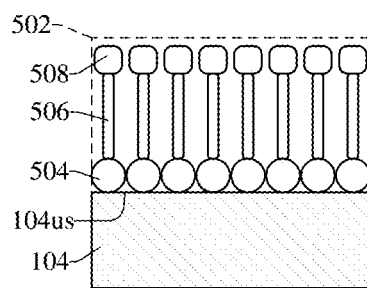

As shown in cross-sectional view 501 of FIG. 5B, in some embodiments, the SAM 502 is formed over the first ILD structure 104 in such a manner that the SAM 502 comprises a head group 504 connected to a terminal group 508 (i.e., function group) by way of a molecular chain 506 (i.e., tail). The head group 504 is configured to adhere to preferred surfaces such as the upper surface 104us of the first ILD structure 104 while not adhering to other surfaces such as an upper surface (112us of FIG. 5A) of the conductive capping layer (112 of FIG. 5A). In some embodiments, the head group 504 may for example, be or comprise butyltriethoxysilane, cyclohexyltrimethoxysilane, cyclopentyltrimethoxysilane, dodecyltriethoxysilane, dodecyltrimethoxysilane, decyltriethoxysilane, dimethoxy(methyl)-n-octylsilane, triethoxyethylsilane, ethyltrimethoxysilane, hexyltrimethoxysilane, hexyltriethoxysilane, hexadecyltrimethoxysilane, hexadecyltriethoxysilane, triethoxymethylsilane, trimethoxy(methyl)silane, methoxy(dimethyl)octadecylsilane, methoxy(dimethyl)-n-octylsilane, octadecyltriethoxysilane, triethoxy-n-octylsilane, octadecyltrimethoxysilane, trimethoxy(propyl)silane, trimethoxy-n-octylsilane, triethoxy(propyl)silane, methane, ethane, propane, butane, pentane, hexane, heptane, octane, nonane, decane, undecane, dodecane, pentadecane, hexadecane, any combination of the foregoing, or the like. In further embodiments, the molecular chain 506 may, for example, comprise an alkyl chain, such as methylene $(CH_2)_n$. In yet further embodiments, the terminal group 508 has a hydrophobic interfacial property that repels dielectric material, thereby preventing dielectric material from adhering to the SAM 502. In some embodiments, the terminal group 508 may comprise a methyl group ($CH_3$), which provides the hydrophobic interfacial property.

Figure 6:
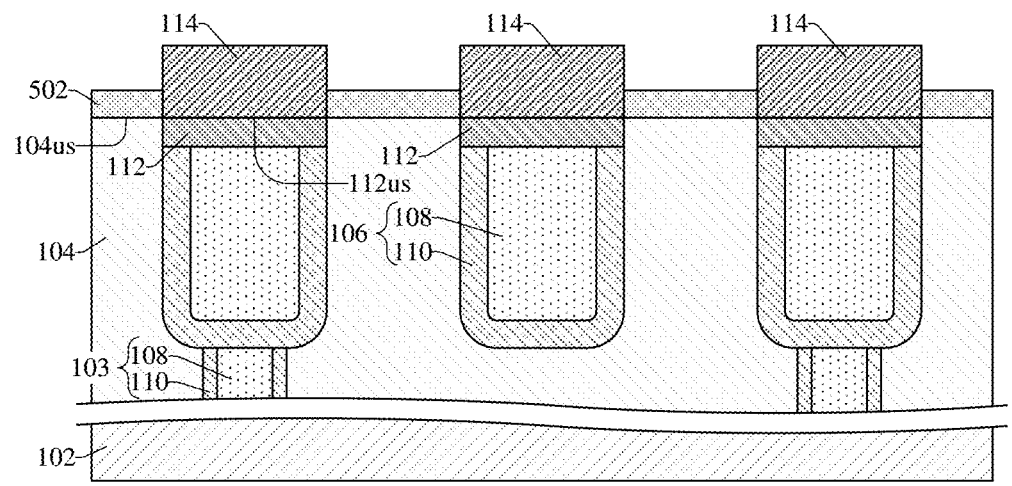

As shown in cross-sectional view 600 of FIG. 6, a dielectric capping layer 114 is selectively formed over the conductive capping layer 112, such that the dielectric capping layer 114 is not formed over the SAM 502. In some embodiments, the dielectric capping layer 114 may, for example, be or comprise aluminum nitride, aluminum oxynitride, aluminum oxide (e.g., $Al_2O_3$), silicon oxycarbide, silicon carbon nitride, silicon nitride, silicon carbon oxynitride, silicon dioxide, silicon carbide, silicon oxynitride, another suitable dielectric material, or any combination of the foregoing. In further embodiments, the dielectric capping layer 114 is formed to a thickness of about 2 to 100 Angstroms or another suitable thickness value. In some embodiments, the terminal group (508 of FIG. 5B) of the SAM 502 comprises the hydrophobic surface which prevents the dielectric capping layer 114 from adhering or bonding to the SAM 502. Thus, in some embodiments, the SAM 502 is configured to prevent and/or block deposition of the dielectric capping layer 114 on the upper surface of the SAM 502 such that the dielectric capping layer 114 may be selectively deposited in areas in which the SAM 502 is not located. In further embodiments, the dielectric capping layer 114 is selectively deposited by, for example, CVD, ALD, or another suitable deposition or growth process. In yet further embodiments, the dielectric capping layer 114 is configured to prevent damage to the conductive capping layer 112 and/or the plurality of conductive wires 106 during subsequent processing steps (e.g., see FIG. 10).

Figure 7:
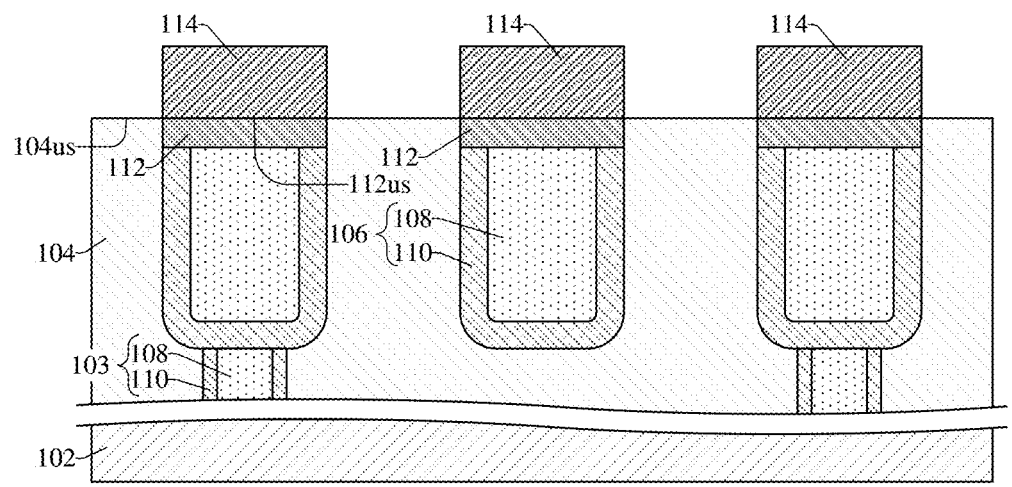

As shown in cross-sectional view 700 of FIG. 7, a removal process is performed to remove the SAM (502 of FIG. 6) from the upper surface 104us of the first ILD structure 104. In some embodiments, the removal process includes exposing the structure of FIG. 6 to a removal plasma (e.g., hydrogen ($H_2$)) that is configured to remove the SAM (502 of FIG. 6).

Figure 8:
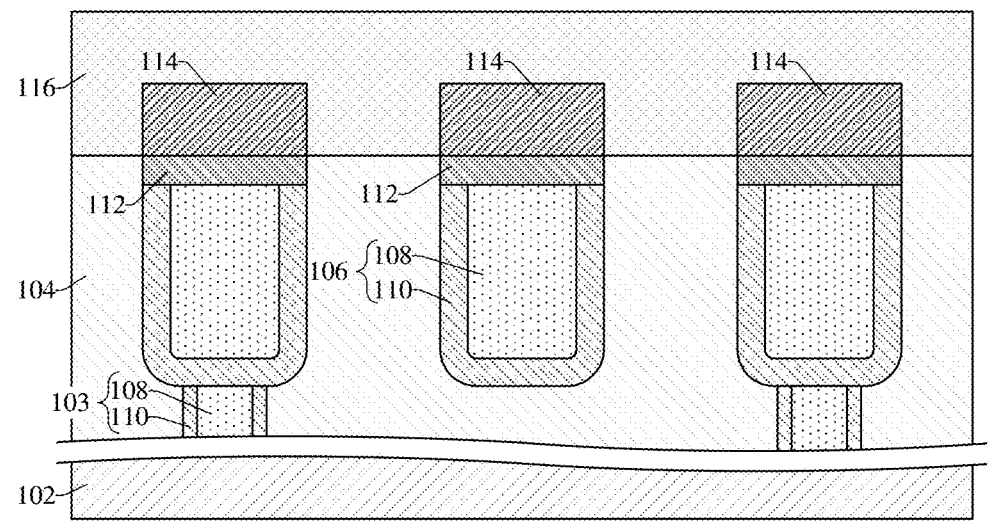

As shown in cross-sectional view 800 of FIG. 8, an etch stop layer 116 is formed over the first ILD structure 104 and the dielectric capping layer 114. In some embodiments, the etch stop layer 116 may be deposited by PVD, CVD, PECVD, ALD, plasma enhanced ALD (PEALD), or another suitable growth or deposition process. In some embodiments, the etch stop layer 116 may, for example, be or comprise silicon oxycarbide, silicon carbon nitride, silicon nitride, silicon carbon oxynitride, silicon dioxide, silicon carbide, silicon oxynitride, aluminum nitride, aluminum oxynitride, aluminum oxide, another dielectric material, or any combination of the foregoing. In further embodiments, the etch stop layer 116 may be formed to a thickness within a range of about 5 to 200 Angstroms or another suitable thickness value.

Figure 9:
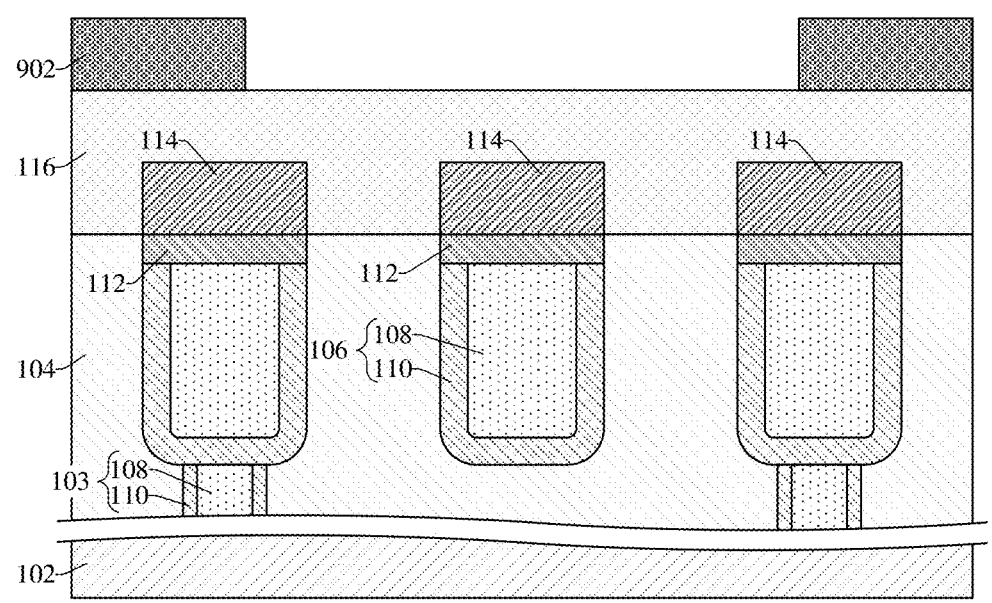

As shown in cross-sectional view 900 of FIG. 9, a masking layer 902 is formed over the etch stop layer 116. In some embodiments, the masking layer 902 may include a hard mask layer, a photoresist, any combination of the foregoing, or the like.

Figure 10:
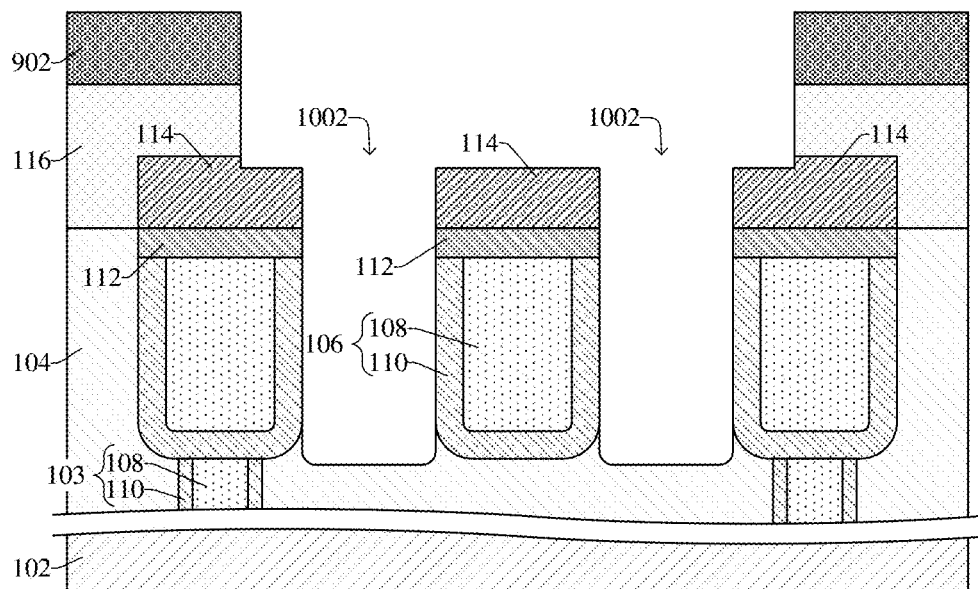

As shown in cross-sectional view 1000 of FIG. 10, a patterning process is performed on the etch stop layer 116 and the first ILD structure 104 according to the masking layer 902, thereby forming a plurality of openings 1002 within the first ILD structure 104 and between adjacent conductive wires 106. In some embodiments, the patterning process may include performing a dry etch process, where the dry etch process may include using one or more etchants, such as fluorine-based etchants and/or chlorine-based etchants. For example, the chlorine-based etchants may, for example, be or comprise boron chloride (e.g., $BCl_3$), chloride gas ($Cl_2$), a combination of the foregoing, or the like. In addition, the fluorine-based etchants may, for example, be or comprise carbon tetrafluoride (e.g., $CF_4$), sulfur hexafluoride (e.g., $SF_6$), any combination of the foregoing, or the like. The dielectric capping layer 114 is configured to prevent damage to the conductive capping layer 112 and/or the conductive wires 106 by the chlorine-based etchants, thereby mitigating and/or preventing formation of metal ions during the patterning process. This may mitigate and/or prevent time dependent dielectric breakdown (TDDB) of dielectric layers adjacent to the conductive wires 106, delamination of the conductive wires 106 and the conductive capping layer 112, over-etching of the conductive wires 106 and the conductive capping layer 112, and/or formation of leakage paths between adjacent conductive wires 106, thereby increasing a reliability and performance of the conductive wires 106 and other metallization layers (e.g., the conductive contacts 103). Subsequently, a removal process is performed to remove the masking layer 902 (not shown). In some embodiments, the removal process may remove at least a portion of the etch stop layer 116, thereby decreasing a thickness of the etch stop layer 116.

Figure 11:
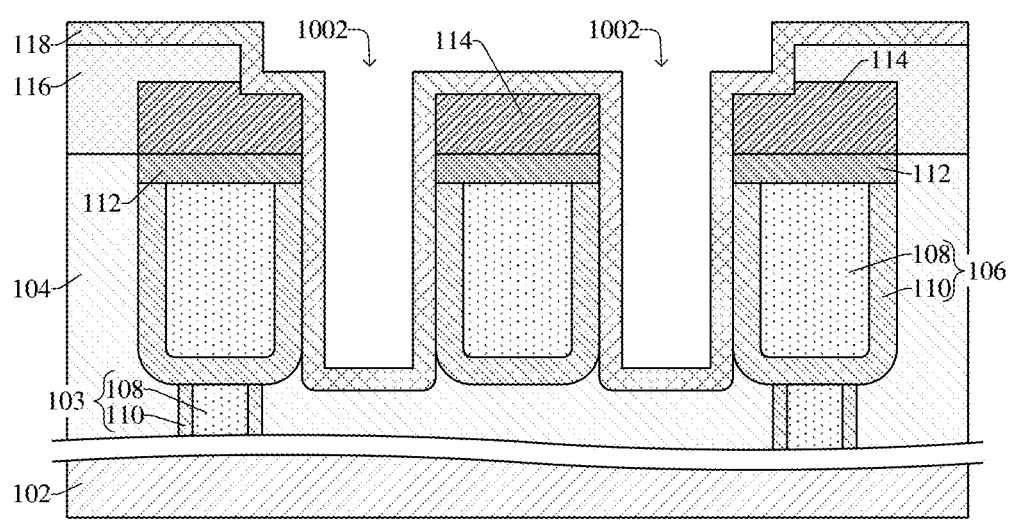

As shown in cross-sectional view 1100 of FIG. 11, an upper dielectric layer 118 is formed over the etch stop layer 116 and the first ILD structure 104. In some embodiments, the upper dielectric layer 118 may be deposited by PVD, CVD, PECVD, ALD, PEALD, or another suitable growth or deposition process. In some embodiments, the upper dielectric layer 118 may, for example, be or comprise silicon oxycarbide, silicon carbon nitride, silicon nitride, silicon carbon oxynitride, silicon dioxide, silicon carbide, silicon oxynitride, aluminum nitride, aluminum oxynitride, aluminum oxide, another dielectric material, or any combination of the foregoing. In further embodiments, the upper dielectric layer 118 may be formed to a thickness within a range of about 5 to 200 Angstroms or another suitable thickness value. Further, the upper dielectric layer 118 may be formed such that it lines the openings 1002.

Figure 12:
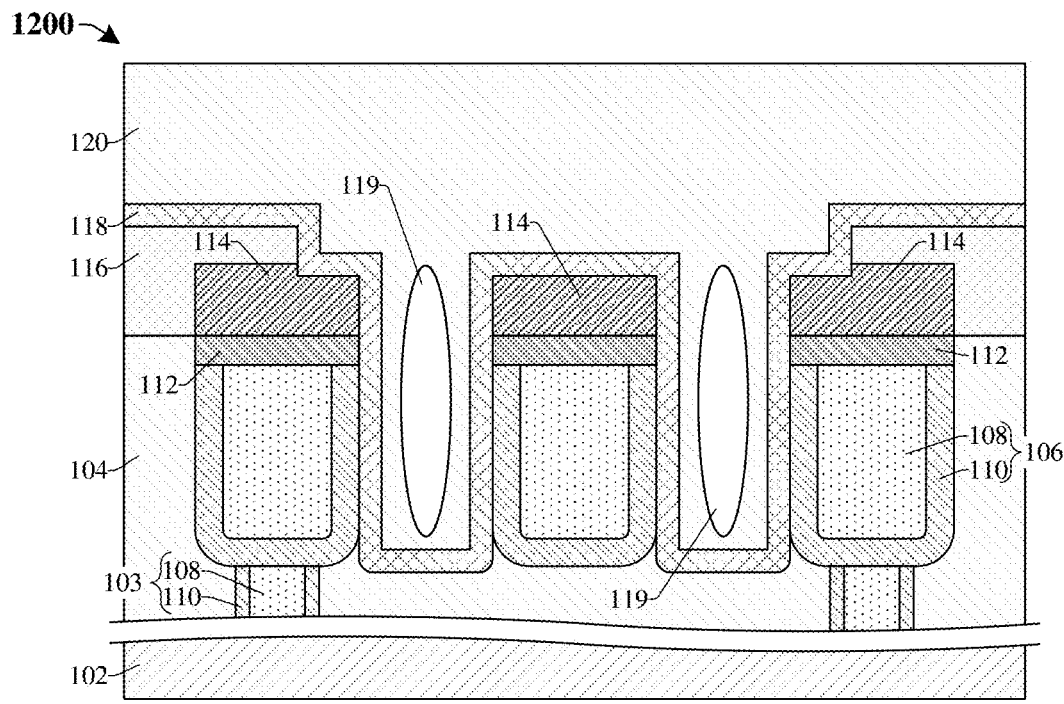

As shown in cross-sectional view 1200 of FIG. 12, a second ILD structure 120 is formed over the upper dielectric layer 118. The second ILD structure 120 may, for example, be or comprise silicon dioxide, hydrogen-containing silicon oxycarbide (SiCOH), a low-k dielectric material, an extreme low-k dielectric material, another suitable dielectric material, or any combination of the foregoing. Further, the second ILD structure 120 comprises a plurality of air-gaps 119, where the air-gaps 119 are disposed between adjacent conductive wires 106. The air-gaps 119 are configured to reduce an effective dielectric constant of the second ILD structure 120, such that, in some embodiments, the effective dielectric constant of the second ILD structure 120 is within a range of about 2 to 3.6 or another suitable range. By reducing the dielectric constant between adjacent conductive wires 106, a capacitance between the adjacent conductive wires 106 is reduced, thereby increasing a performance of the conductive wires 106 and the conductive contacts 103. In yet further embodiments, a porosity of the second ILD structure 120 may, for example, be within a range of about 0.1% to 40% or another suitable value.

In some embodiments, the air-gaps 119 may be introduced in the second ILD structure 120 by choosing a suitable formation process. A suitable process for forming the second ILD structure 120 with air-gaps 119 can be a non-conformal deposition process such as, for example, plasma enhanced chemical vapor deposition (PECVD). Non-conformal deposition processes creates air-gaps 119 in recessed areas such as between adjacent conductive wires 106 (e.g., in the location of the openings 1002 of FIG. 11). An exemplary non-conformal deposition process is plasma-enhanced CVD, however, other deposition or growth processes are amenable. In some embodiments, by forming the second ILD structure 120 with a porosity within a range of about 0.1% to 40%, an effective dielectric constant of the second ILD structure 120 may be within a range of about 2 to 3.6.

Figure 13:
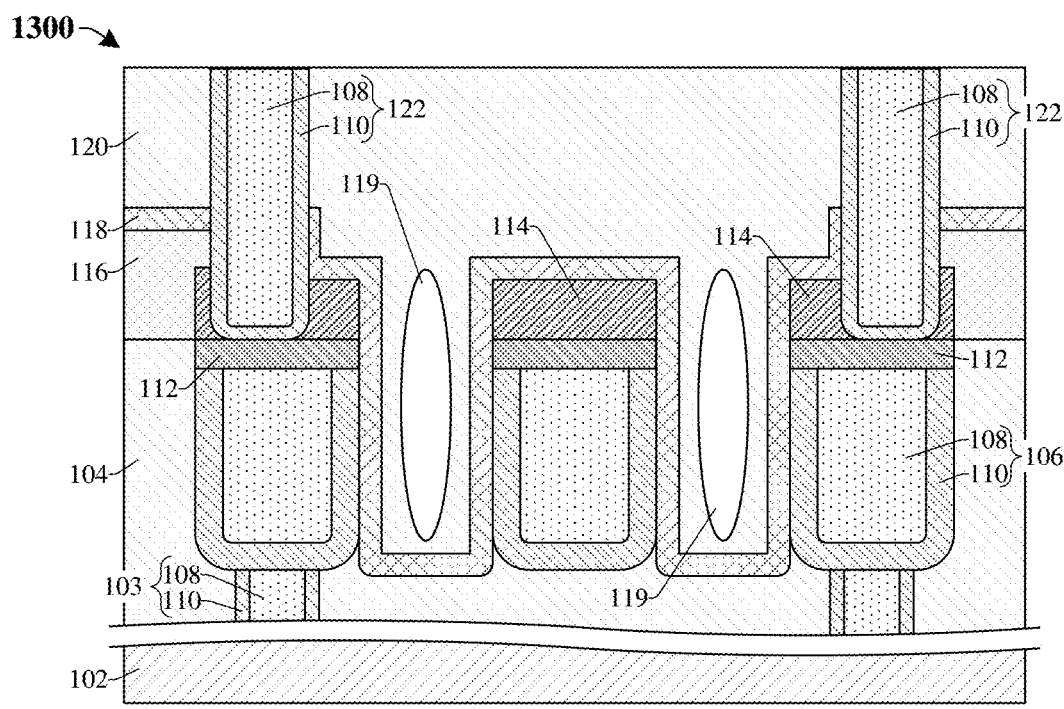

As shown in cross-sectional view 1300 of FIG. 13, a plurality of conductive vias 122 is formed over the plurality of conductive wires 106. The conductive vias 122 extend through the second ILD structure 120 to contact the conductive capping layer 112, such that the conductive vias 122 are electrically coupled to the conductive wires 106. In some embodiments, the conductive vias 122 are formed by a single damascene process or a dual damascene process. In yet further embodiments, the conductive vias 122 each comprise a conductive body 108 and a conductive liner 110 that laterally encloses the conductive body 108.

Figure 14:
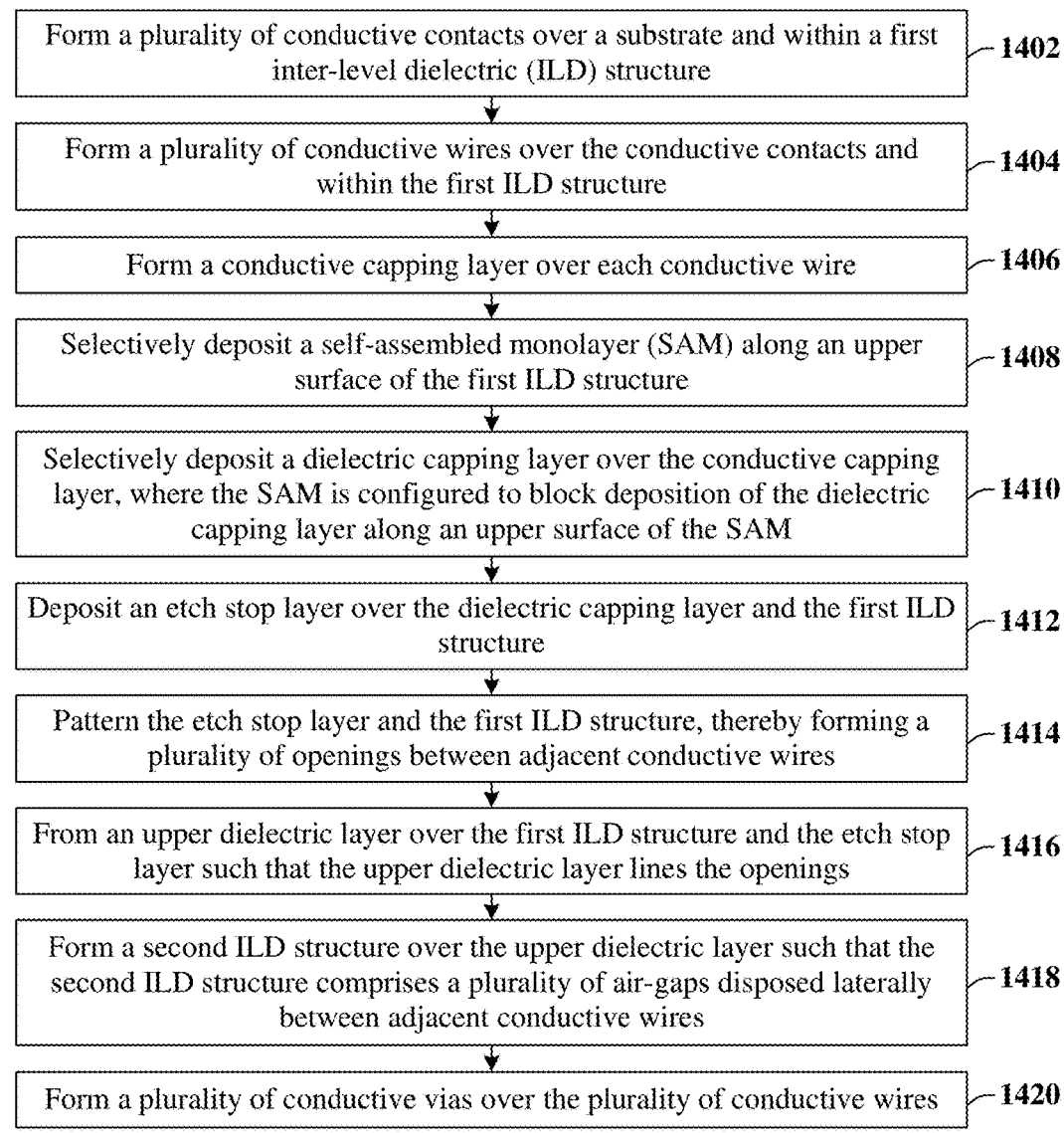
FIG. 14 illustrates a methodology in flowchart format that illustrates some embodiments of a method of forming an integrated chip having a dielectric capping layer overlying conductive wires and air-gaps disposed between adjacent conductive wires.

FIG. 14 illustrates a method 1400 of forming an interconnect structure having a dielectric capping layer overlying conductive wires and air-gaps disposed between adjacent conductive wires according to the present disclosure. Although the method 1400 is illustrated and/or described as a series of acts or events, it will be appreciated that the method 1400 is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1402, a plurality of conductive contacts is formed over a substrate and within a first inter-level dielectric (ILD) structure. FIG. 4 illustrates a cross-sectional view 400 corresponding to some embodiments of act 1402.

At act 1404, a plurality of conductive wires is formed over the conductive contacts and within the first ILD structure. FIG. 4 illustrates a cross-sectional view 400 corresponding to some embodiments of act 1404.

At act 1406, a conductive capping layer is formed over each conductive wire. FIG. 4 illustrates a cross-sectional view 400 corresponding to some embodiments of act 1406.

At act 1408, a self-assembled monolayer (SAM) is selectively deposited along an upper surface of the first ILD structure. FIG. 5A illustrates a cross-sectional view 500 corresponding to some embodiments of act 1408.

At act 1410, a dielectric capping layer is selectively deposited over the conductive capping layer, where the SAM is configured to block deposition of the dielectric capping layer along an upper surface of the SAM. FIG. 6 illustrates a cross-sectional view 600 corresponding to some embodiments of act 1410.

At act 1412, an etch stop layer is deposited over the dielectric capping layer and the first ILD structure. FIG. 8 illustrates a cross-sectional view 800 corresponding to some embodiments of act 1412.

At act 1414, the etch stop layer and the first ILD structure are patterned, thereby forming a plurality of openings between adjacent conductive wires. FIG. 10 illustrates a cross-sectional view 1000 corresponding to some embodiments of act 1414.

At act 1416, an upper dielectric layer is formed over the first ILD structure and the etch stop layer such that the upper dielectric layer lines the openings. FIG. 11 illustrates a cross-sectional view 1100 corresponding to some embodiments of act 1416.

At act 1418, a second ILD structure is formed over the upper dielectric layer such that the second ILD structure comprises a plurality of air-gaps disposed laterally between adjacent conductive wires. FIG. 12 illustrates a cross-sectional view 1200 corresponding to some embodiments of act 1418.

At act 1420, a plurality of conductive vias is formed over the plurality of conductive wires. FIG. 13 illustrates a cross-sectional view 1300 corresponding to some embodiments of act 1420.

Figure 15:
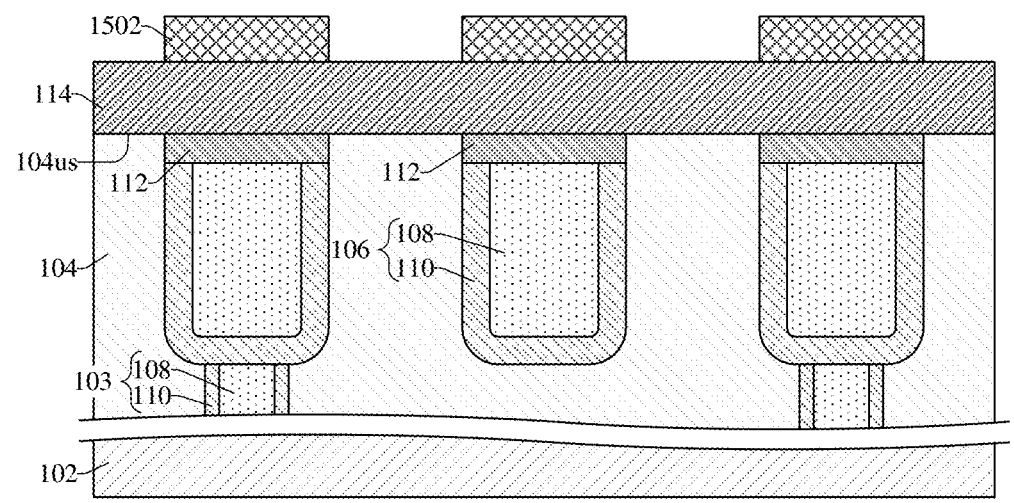
FIGS. 15-16 illustrate cross-sectional views of some alternative embodiments of the method of FIGS. 4-13.
Figure 16:
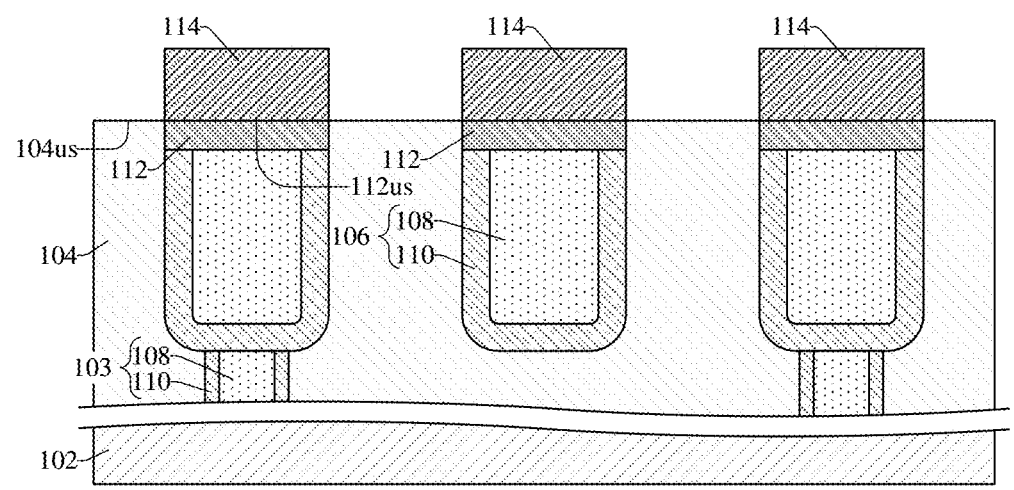

FIGS. 15-16 illustrate cross-sectional views 1500-1600 of some embodiments of acts that may be performed in place of the acts at FIGS. 5A-7, such that the method of FIGS. 4-13 may alternatively proceed from FIG. 4 to FIGS. 15-16 and then from FIG. 16 to FIGS. 8-13 (skipping FIGS. 5A-7). In yet further embodiments, FIGS. 15-16 illustrate cross-sectional views 1500-1600 of some alternative embodiments of selectively forming a dielectric capping layer 114 over the conductive capping layer 112.

As illustrated by the cross-sectional view 1500 of FIG. 15, a dielectric capping layer 114 is deposited over the first ILD structure 104 and the conductive capping layer 112. Subsequently, a masking layer 1502 is formed over the dielectric capping layer 114. In some embodiments, the masking layer 1502 is formed such that it directly overlies a corresponding conductive wire 106. In further embodiments, the dielectric capping layer 114 may be deposited by CVD, ALD, or another suitable growth or deposition process. In some embodiments, the dielectric capping layer 114 may, for example, be or comprise aluminum nitride, aluminum oxynitride, aluminum oxide (e.g., $Al_2O_3$), silicon oxycarbide, silicon carbon nitride, silicon nitride, silicon carbon oxynitride, silicon dioxide, silicon carbide, silicon oxynitride, another suitable dielectric material, or any combination of the foregoing. In further embodiments, the dielectric capping layer 114 is formed to a thickness of about 2 to 100 Angstroms or another suitable thickness value.

As illustrated by the cross-sectional view 1600 of FIG. 16, a patterning process is performed on the dielectric capping layer 114 according to the masking layer (1502 of FIG. 15). In some embodiments, the patterning process includes performing a dry etch process, a wet etch process, another suitable etch process, or any combination of the foregoing. Further, in some embodiments, the patterning process is performed such that the dielectric capping layer 114 is removed from the upper surface 104us of the first ILD structure 104.

Figure 17:
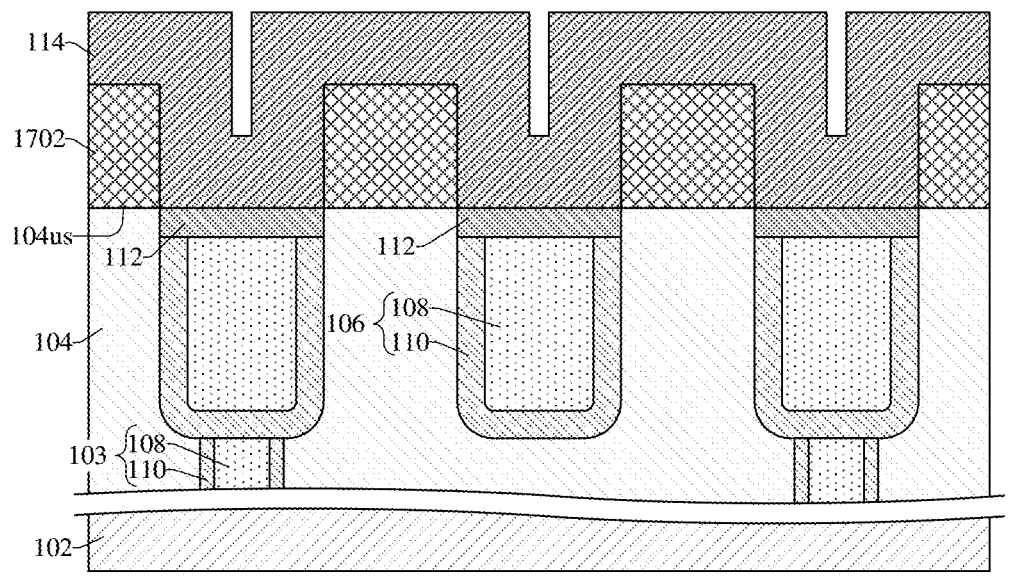
FIGS. 17-18 illustrate cross-sectional views of some additional alternative embodiments of the method of FIGS. 4-13.
Figure 18:
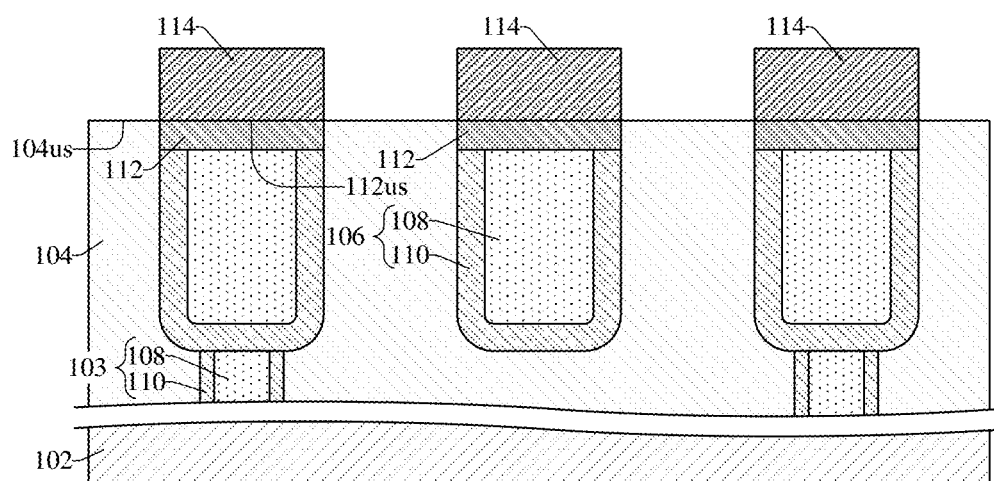

FIGS. 17-18 illustrate cross-sectional views 1700-1800 of some embodiments of acts that may be performed in place of the acts at FIGS. 5A-7, such that the method of FIGS. 4-13 may alternatively proceed from FIG. 4 to FIGS. 17-18 and then from FIG. 18 to FIGS. 8-13 (skipping FIGS. 5A-7). In yet further embodiments, FIGS. 17-18 illustrate cross-sectional views 1700-1800 of some alternative embodiments of selectively forming a dielectric capping layer 114 over the conductive capping layer 112.

As illustrated by the cross-sectional view 1700 of FIG. 17, a masking layer 1702 is formed over the first ILD structure 104. In some embodiments, the masking layer 1702 may be formed such that it is laterally offset from the conductive capping layer 112 and comprises sidewalls defining a plurality of openings that are spaced directly over a corresponding conductive wire 106. In such embodiments, the masking layer 1702 is selectively deposited on the upper surface 104us of the first ILD structure 104. Subsequently, the dielectric capping layer 114 is deposited over the masking layer 1702 and the conductive capping layer 112. In some embodiments, the dielectric capping layer 114 may, for example, be deposited by CVD, PVD, or another suitable deposition or growth process.

As illustrated by the cross-sectional view 1800 of FIG. 18, a removal process is performed on the dielectric capping layer 114 to remove the dielectric capping layer 114 from above the masking layer (1702 of FIG. 17). In some embodiments, the removal process includes performing a planarization process (e.g., a chemical mechanical planarization (CMP) process) into the dielectric capping layer 114 and/or the masking layer (1702 of FIG. 17). In yet further embodiments, the removal process includes performing a wet etch process, a dry etch process, or another suitable etch process on the dielectric capping layer 114. In yet further embodiments, the removal process is configured to remove the masking layer (1702 of FIG. 17) from the upper surface 104us of the first ILD structure 104.

Accordingly, in some embodiments, the present application relates to a conductive wire overlying a substrate, a conductive capping layer overlying the conductive wire, and a dielectric capping layer overlying the conductive capping layer. Further, an inter-level dielectric (ILD) structure overlies the conductive wire such that a pair of air-gaps are disposed within the ILD structure. The conductive wire is spaced laterally between the pair of air-gaps.

In various embodiments, the present application provides a semiconductor structure comprising: a first inter-level dielectric (ILD) structure overlying a substrate; a conductive contact directly overlying the substrate and disposed within the first ILD structure; a conductive wire directly overlying the conductive contact; a conductive capping layer overlying the conductive wire, wherein the conductive capping layer continuously extends along an upper surface of the conductive wire; a second ILD structure overlying the conductive capping layer, wherein the second ILD structure is disposed along opposing sides of the conductive wire; a pair of air-gaps disposed within the second ILD structure, wherein the conductive wire is spaced laterally between the pair of air-gaps; and a dielectric capping layer disposed along an upper surface of the conductive capping layer, wherein the dielectric capping layer is spaced laterally between the pair of air-gaps, wherein the dielectric capping layer is laterally offset from an upper surface of the first ILD structure, wherein a bottom surface of the dielectric capping layer is aligned vertically with the upper surface of the first ILD structure.

In various embodiments, the present application provides an integrated chip comprising: an interconnect dielectric structure overlying a substrate; a plurality of conductive contacts overlying the substrate and disposed within the interconnect dielectric structure; a plurality of conductive wires directly overlying the plurality of conductive contacts and disposed within the interconnect dielectric structure, wherein the conductive wires and the conductive contacts respectively comprises a conductive body and a conductive liner that laterally encloses the conductive body; a conductive capping layer disposed along an upper surface of each conductive wire; a plurality of air-gaps disposed within the interconnect dielectric structure, wherein the air-gaps are spaced laterally between adjacent conductive wires in the plurality of conductive wires, wherein a top surface of the plurality of air-gaps is disposed above a top surface of the conductive capping layer; and a dielectric capping layer disposed along an upper surface of the conductive capping layer such that the dielectric capping layer overlies each conductive wire, wherein a thickness of the dielectric capping layer discretely decreases from a first sidewall of the plurality of conductive wires to a second sidewall of the plurality of conductive wires in a direction towards the plurality of air-gaps, wherein sidewalls of the dielectric capping layer are aligned with sidewalls of the conductive capping layer, and wherein the dielectric capping layer directly contacts the conductive capping layer.

In various embodiments, the present application provides a method of forming a semiconductor device, comprising: forming a first inter-level dielectric (ILD) structure over a substrate; forming a plurality of conductive contacts within the first ILD structure; forming a plurality of conductive wires within the first ILD structure and over the plurality of conductive contacts; forming a conductive capping layer along an upper surface of each conductive wire; selectively depositing a dielectric capping layer over the conductive capping layer such that the dielectric capping layer is laterally offset from an upper surface of the first ILD structure, wherein a thickness of the dielectric capping layer is greater than a thickness of the conductive capping layer; forming an etch stop layer over the dielectric capping layer such that the etch stop layer extends from the upper surface of the first ILD structure, along a sidewall of the dielectric capping layer, to an upper surface of the dielectric capping layer; patterning the etch stop layer and the first ILD structure, thereby defining a plurality of openings disposed laterally between adjacent conductive wires within the plurality of conductive wires; forming an upper dielectric layer along sidewalls of the conductive wires and an upper surface of the etch stop layer such that the upper dielectric layer lines the plurality of openings; and forming a second ILD structure over the plurality of conductive wires such that the second ILD structure comprises a plurality of air-gaps spaced laterally between adjacent conductive wires within the plurality of conductive wires, wherein a bottom surface of the second ILD structure is disposed below a top surface of the first ILD structure, and wherein the second ILD structure is formed such that the air-gaps are disposed within the openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a conductive wire disposed within a first dielectric structure;
an etch stop layer overlying the first dielectric structure;
a dielectric capping layer disposed between an upper surface of the conductive wire and the etch stop layer; and
an upper dielectric layer disposed along sidewalls of the conductive wire and an upper surface of the etch stop layer, wherein the upper dielectric layer comprises a lateral segment, a first vertical segment, and a second vertical segment, wherein the lateral segment continuously extends from the first vertical segment to the second vertical segment, wherein the lateral segment contacts an upper surface of the dielectric capping layer, and wherein the first vertical segment contacts a first sidewall of the dielectric capping layer and the second vertical segment contacts a second sidewall of the dielectric capping layer.

2. The semiconductor structure of claim 1, further comprising:
a conductive capping layer disposed between the conductive wire and the dielectric capping layer, wherein a thickness of the dielectric capping layer is greater than a thickness of the conductive capping layer.

3. The semiconductor structure of claim 1, wherein the upper dielectric layer has a top surface vertically offset the lateral segment.

4. The semiconductor structure of claim 1, further comprising:
an air-gap adjacent to the conductive wire, wherein a height of the air-gap is greater than a height of the conductive wire.

5. The semiconductor structure of claim 1, further comprising:
a second dielectric structure overlying the upper dielectric layer and disposed along sidewalls of the conductive wire, wherein a bottom surface of the second dielectric structure is disposed vertically below a top surface of the first dielectric structure.

6. The semiconductor structure of claim 5, wherein the upper dielectric layer is disposed between the first dielectric structure and the second dielectric structure, wherein a bottom surface of the upper dielectric layer is disposed below a bottom surface of the conductive wire.

7. The semiconductor structure of claim 6, wherein the first and second dielectric structures respectively comprise a first dielectric material, wherein the upper dielectric layer and the dielectric capping layer respectively comprise a second dielectric material different from the first dielectric material.

8. The semiconductor structure of claim 7, wherein a dielectric constant of the first dielectric material is less than a dielectric constant of the second dielectric material.

9. The semiconductor structure of claim 1, further comprising:
a conductive contact overlying a substrate, wherein the conductive contact underlies the conductive wire, wherein the conductive contact is disposed within a first metallization layer that directly overlies the substrate, wherein the conductive wire is disposed within a second metallization layer that directly overlies the first metallization layer.

10. The semiconductor structure of claim 9, further comprising:
a transistor disposed over the substrate, wherein the transistor comprises source/drain regions disposed within the substrate, a gate dielectric layer disposed along the substrate, and a gate electrode overlying the gate dielectric layer; and
wherein a bottom surface of the conductive contact is disposed below a top surface of the gate electrode, wherein the first dielectric structure laterally encloses the gate electrode.

11. An integrated chip comprising:
a first dielectric structure overlying a substrate;
a plurality of conductive wires disposed within the first dielectric structure;
a conductive capping layer disposed along an upper surface of the conductive wires;
a plurality of air-gaps spaced laterally between adjacent conductive wires in the plurality of conductive wires; and
a dielectric capping layer disposed along an upper surface of the conductive capping layer such that the dielectric capping layer overlies the conductive wires, wherein the dielectric capping layer has a first thickness over a first side of a first conductive wire in the plurality of conductive wires and a second thickness over a second side of the first conductive wire, wherein the first thickness is greater than the second thickness, and wherein the second thickness is non-zero.

12. The integrated chip of claim 11, wherein sidewalls of the dielectric capping layer are aligned with sidewalls of the conductive capping layer, and wherein the dielectric capping layer directly contacts the conductive capping layer.

13. The integrated chip of claim 11, further comprising:
an etch stop layer overlying the dielectric capping layer, wherein a bottom surface of the etch stop layer is aligned with a bottom surface of the dielectric capping layer, wherein a thickness of the etch stop layer is greater than the first thickness of the dielectric capping layer.

14. The integrated chip of claim 11, wherein the second thickness is greater than a thickness of the conductive capping layer.

15. The integrated chip of claim 11, wherein sidewalls of the dielectric capping layer are aligned with sidewalls of the plurality of conductive wires.

16. The integrated chip of claim 11, further comprising:
a plurality of conductive vias directly overlying the plurality of conductive wires, wherein the conductive vias extend continuously from a top surface of the dielectric capping layer to a top surface of the conductive capping layer, wherein a width of the dielectric capping layer is greater than a width of the conductive vias.

17. The integrated chip of claim 11, further comprising:
an upper dielectric layer overlying the dielectric capping layer, wherein the air-gaps are spaced between opposing sidewalls of the upper dielectric layer.

18. An integrated chip comprising:
a plurality of conductive wires disposed within a first dielectric structure;
an etch stop layer disposed along a top surface of the first dielectric structure;

a second dielectric structure overlying the first dielectric structure and extending between adjacent conductive wires in the plurality of conductive wires, wherein a bottom surface of the second dielectric structure is disposed below the etch stop layer;

a plurality of air-gaps disposed in the second dielectric structure and spaced between the adjacent conductive wires;

an upper dielectric layer disposed between the first dielectric structure and the second dielectric structure, wherein the upper dielectric layer continuously laterally extends along the bottom surface of the second dielectric structure; and a dielectric capping layer disposed along a top surface of the plurality of conductive wires, wherein the upper dielectric layer directly contacts a sidewall of the dielectric capping layer, wherein the upper dielectric layer comprises a top surface vertically offset from an upper surface, wherein the top surface and the upper surface of the upper dielectric layer both overlie the dielectric capping layer.

19. The integrated chip of claim 18, wherein top surfaces of the air-gaps are disposed below a top surface of the upper dielectric layer.

20. The integrated chip of claim 18, wherein the etch stop layer is discontinuous in a region between the upper surface of the upper dielectric layer and the dielectric capping layer.

* * * * *